United States Patent [19]

Taka

[11] Patent Number: 5,148,252
[45] Date of Patent: Sep. 15, 1992

[54] BIPOLAR TRANSISTOR
[75] Inventor: Shin-ichi Taka, Yokosuka, Japan
[73] Assignee: Kabushiki Kaisha Toshiba, Kawasaki, Japan
[21] Appl. No.: 837,099
[22] Filed: Feb. 18, 1992

Related U.S. Application Data
[63] Continuation of Ser. No. 649,899, Feb. 1, 1991, abandoned.

[30] Foreign Application Priority Data
Feb. 13, 1990 [JP] Japan ................................. 2-29687

[51] Int. Cl.$^5$ .......................................... H01L 29/72
[52] U.S. Cl. ........................... 357/34; 357/54; 357/59; 357/55
[58] Field of Search ................. 357/34, 59, 54, 55

[56] References Cited
U.S. PATENT DOCUMENTS
4,996,581 2/1991 Hamasaki ................................. 357/34
5,001,533 3/1991 Yamaguchi ............................. 357/34

Primary Examiner—Edward J. Wojciechowicz
Attorney, Agent, or Firm—Finnegan, Henderson, Farabow, Garrett and Dunner

[57] ABSTRACT

A bipolar transistor includes a p-type external base region formed on the major surface of an n-type semiconductor substrate, a plurality of p-type internal base regions formed to be surrounded by the external base region, and emitter regions of a first conductivity type respectively formed in the internal base regions. An oxide film and a nitride film, stacked on each other, extend outward from an outer peripheral portion of the external base region on the major surface of the semiconductor substrate, and define openings therein. A p-type semiconductor film is formed on the external base region in the openings. A first conductive layer having a p-type semiconductor is formed on the nitride film and the semiconductor film. Side-wall-like oxide films are formed on side wall portions, of the semiconductor film and the first conductive layer, opposite to the emitter regions. A second conductive layer having an n-type semiconductor and serving as an emitter electrode extraction portion is formed on the side-wall-like oxide films to be in contact with the emitter regions.

11 Claims, 5 Drawing Sheets

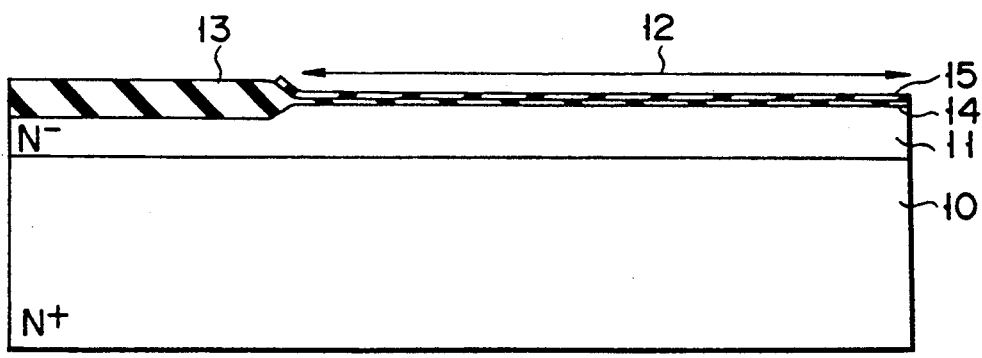
F I G. 3A

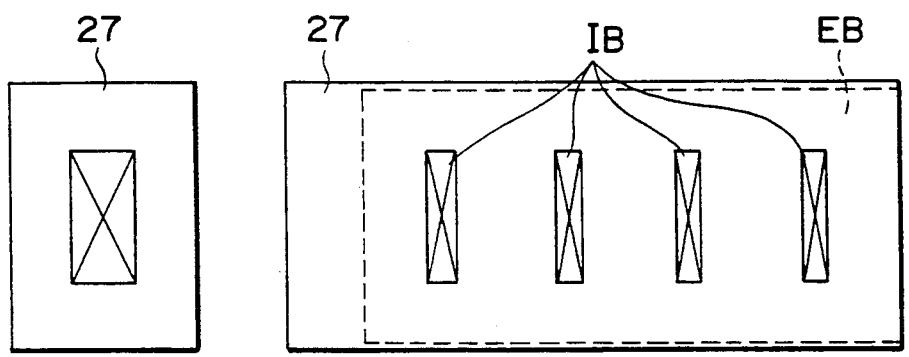
F I G. 4

DIPOLAR TRANSISTOR

This application is a continuation of application Ser. No. 07/649,899, filed Feb. 1, 1992, now abandoned.

BACKGROUND OF THE INVENTION

1. Field of the Invention

The present invention relates to a bipolar transistor and, more particularly, to a high-frequency transistor having a cutoff frequency $f_T$ of 10 GHz or more.

2. Description of the Related Art

In conventional bipolar transistors, techniques used to increase the operating speed can be roughly classified into two types. One is a technique used for discrete devices, i.e., a technique associated with a so-called comb transistor. FIG. 1 shows a sectional structure of such a transistor. Referring to FIG. 1, reference numeral 30 denotes an n+-type substrate; and 31, an n−-type epitaxial layer. Reference symbol EB denotes an external base region; IB, an internal base region; and E, an emitter region. Reference numeral 32 denotes an oxide film; 33, a nitride film; 34, an Al external base electrode wiring layer; and 35, an Al emitter electrode wiring layer.

The other technique is associated with a self-aligned transistor used for a high-speed bipolar transistor. FIG. 2 shows a sectional structure of a transistor. Referring to FIG. 2, reference numeral 40 denotes an n+-type substrate; 41, an n−-type epitaxial layer; and 42, a field insulating film for element isolation. Reference symbol EB denotes an external base region; IB, an internal base region; and E, an emitter region. Reference numeral 43 denotes a first oxide film; 44, a nitride film; 45, an external base extraction electrode; 46, a second oxide film; 47 and 48, oxide films on an emitter opening side wall portion; 49, a polysilicon side wall defining an emitter opening; and 50, an emitter electrode.

In the comb transistor shown in FIG. 1, the operating speed is increased by shrink forming. The shrink forming technique has been advanced in accordance with the progress of photolithographic and processing techniques and is expected to be increasingly used in future.

The demands for high-speed elements exceed the progress of photolithography. In order to realize a cutoff frequency as high as $f_T = 20$ GHz at a mounting level, the distance between the emitter and base openings must be sufficiently decreased. In this case, micropatterning of aluminum wiring layers is required. For example, micropatterning must be performed to realize the following sizes: the width of an aluminum wiring layer, 1.5 μm; an emitter/base aluminum wiring layer interval, 0.5 μm; and the thickness of an aluminum wiring layer, 3.0 μm in consideration of a current capacity. It is practically impossible to process such aluminum wiring layers. In addition, since a passivation film formed on aluminum wiring layers cannot be sufficiently buried in grooves, each having a very high aspect ratio, between the aluminum wiring layers, so-called cavities are produced. This leads to a deterioration in reliability.

If a plurality of transistors based on the self-aligning technique shown in FIG. 2 are connected in parallel, the aluminum wiring layer interval can be increased within a controllable range by forming the external base extraction electrode 45 on the peripheral portion of each external base region EB.

The field insulating films 42 for element isolation are, however, formed among the plurality of external base regions EB, and the capacitance between the external base extraction electrode 45 on each field insulating film 42 and the major surface of the semiconductor substrate is large. Therefore, if a large number of transistors formed by self-alignment are connected in parallel, a high-speed operation cannot be performed. The region of each field insulating film 42 must be increased in size by a margin corresponding to an alignment precision deviation of photolithography. This deviation cannot be completely eliminated.

As described above, in a bipolar transistor assembly consisting of a plurality of conventional self-aligned transistors connected in parallel, since the capacitance between each external base extraction electrode and the major surface of the semiconductor substrate is large, if a large number of transistors are connected in parallel, a high-speed operation cannot be performed.

SUMMARY OF THE INVENTION

The present invention has been made to solve the above-described problems, and has as its object to provide an ultra-high-speed bipolar transistor which can be manufactured by normal micropatterning and self-aligning techniques.

According to the present invention, there is provided a bipolar transistor comprising an external base region consisting of a high-concentration diffusion layer of a second conductivity type and formed on a major surface of a semiconductor substrate of a first conductivity type, a plurality of internal base regions containing an impurity of the second conductivity type and formed to be surrounded by the external base region, emitter regions of the first conductivity type respectively formed in the internal base regions, a first insulating layer formed on the major surface of the semiconductor substrate to extend outward from an outer peripheral portion of the external base region and to define openings therein, a semiconductor film containing a impurity of the second conductivity type and formed on the external base region in the openings, a first conductive layer formed on the first insulating layer and the semiconductor film, an insulating film formed on the first conductive layer, a side-wall-like second insulating layer formed on side wall portions, of the semiconductor film and the first conductive layer, opposite to the emitter regions, and on a portion, of the major surface of the semiconductor substrate, extending from the side wall portions to the emitter regions, and a second conductive layer serving as an emitter electrode extraction portion and formed on the second insulating layer to be in contact with the emitter regions.

According to a preferable aspect of the present invention, the first insulating layer is composed of first and second insulating films stacked on each other, and the insulating film formed on the first conductive layer is a third insulating film. In addition, the second insulating layer is composed of fourth and fifth insulating films stacked on each other.

According to another preferable aspect of the present invention, the first conductive layer is composed of a semiconductor film and a metal/semiconductor film both of which contain an impurity of the second conductivity type. In addition, the second conductive layer is composed of a semiconductor film containing a impurity of the first conductivity type.

Unlike a normal self-aligned transistor, the bipolar transistor of the present invention is designed such that a plurality of element portions are formed in one island, and the external base region between adjacent element portions is commonly used thereby. Therefore, the element area can be decreased, and the stray capacitance between the external base extraction electrode and the major surface of the semiconductor substrate can be reduced. With this structure, an emitter opening width and an emitter/base interval which cannot be realized by a normal micropatterning process can be realized, thus providing a structure of a bipolar transistor having a sufficiently low base/collector capacitance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 3A to 3J are sectional views showing semiconductor substrate structures in the respective steps in a method of manufacturing a bipolar transistor according to an embodiment of the present invention; and FIG. 4 is a plan view showing the planar pattern of the structure in FIG. 3J.

DETAILED DESCRIPTION OF THE PREFERRED EMBODIMENTS

Figure 1:
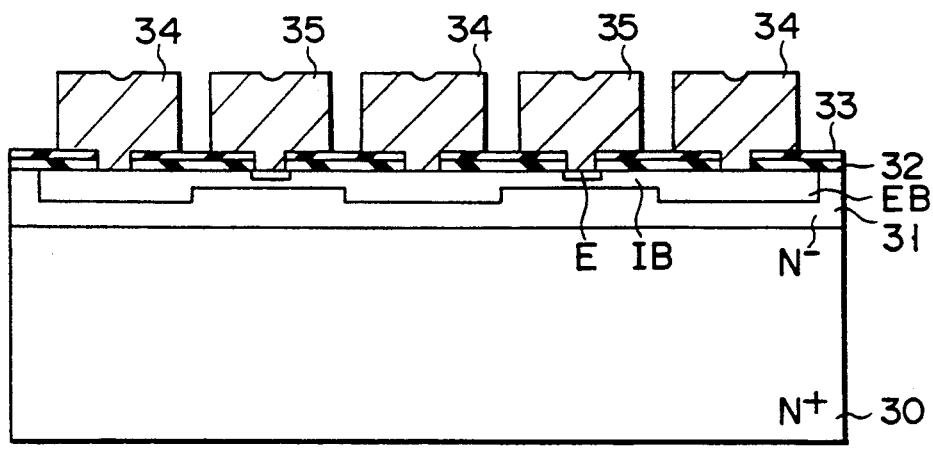
FIG. 1 is a sectional view showing a part of a conventional comb transistor.
Figure 2:
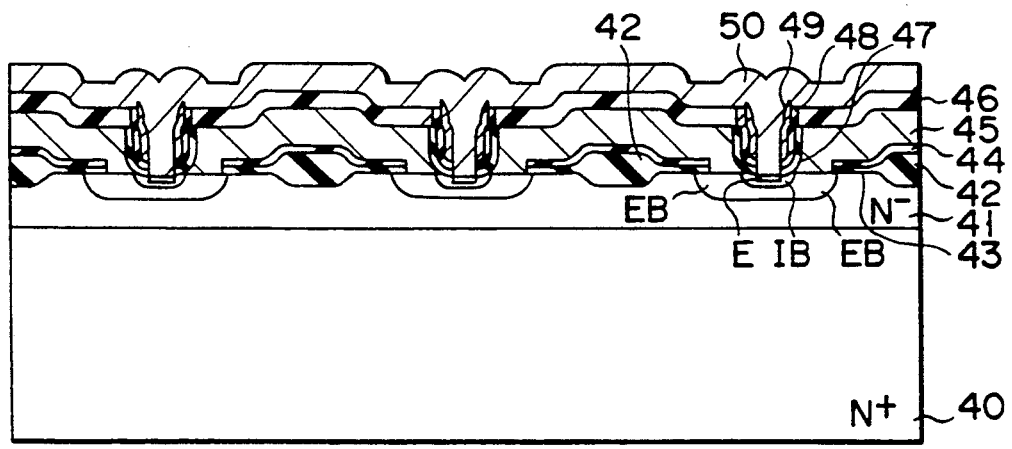
FIG. 2 is a sectional view showing a part of a conventional self-aligned transistor

FIGS. 3A to 3J show the sectional structures of a semiconductor substrate in the respective steps in manufacturing a bipolar transistor. FIG. 4 shows the planar pattern of the structure in FIG. 3J.

A method of manufacturing a bipolar transistor according to the present invention will be described below with reference to FIGS. 3A to 3J.

As shown in FIG. 3A, an n—-type epitaxial layer 11 is formed on the upper surface of an n+-type semiconductor substrate, e.g., an Si substrate 10. A field insulating film 13 is formed on the major surface of the semiconductor substrate 10 (the upper surface of the n—-type epitaxial layer 11) by local oxidation so as to enclose a prospective element formation region 12. The local oxidation is performed by using an oxide protect films consisting of a buffer oxide film 14 and a first nitride film 15. The thickness of the field insulating film 13 is preferably increased to reduce the stray capacitance and the like between a base electrode region (to be formed later) and the semiconductor substrate. However, the surface irregularity can be reduced with a decrease in thickness of the film 13. In order to ensure the surface flatness and increase the thickness of the insulating film, a buried oxide film may be formed. However, such a means is disadvantageous in terms of cost. In this embodiment, a thermal oxide film having a thickness of about 600 nm is directly formed.

Figure 3B:
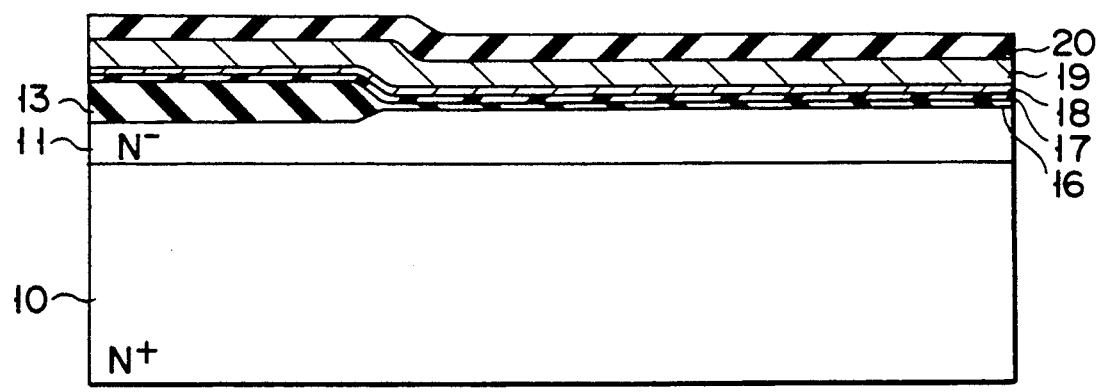

After the oxide protect films used for the local oxidation is removed, the following films are sequentially formed at least on the prospective element formation region on the upper surface of the n—-type epitaxial layer 11, as shown in FIG. 3B: a first insulating film (e.g., a first oxide film having a thickness of about 50 nm) 16 consisting of a relatively thin oxide film; a second insulating film (e.g., a second nitride film having a thickness of about 100 nm) 17 consisting of a nitride film; and a first semiconductor film (e.g., a first polysilicon film having a thickness of about 150 nm) 18. A p-type impurity (e.g., boron) is implanted in a portion corresponding to a prospective external base formation region at a dose of $1 \times 10^{16}/cm^2$. In addition, a first metal/semiconductor film (e.g., a molybdenum/silicide film) 19 is deposited on the resultant structure to a thickness of about 400 nm, and a third insulating film (e.g., a 400-nm thick second oxide film) 20 is then formed by CVD (chemical vapor deposition). In this case, since the first polysilicon film 18 and the molybdenum/silicide film 19 serve as an external base extraction electrode, their resistances must be minimized. In addition, the first polysilicon film 18 serves as a diffusion source for forming an external base region EB. As an external base diffusion source, polysilicon, amorphous silicon, or the like can be easily used. The above-mentioned molybdenum/silicide film 19 may be replaced with another silicide film, as needed.

Note that if the resistance of the first polysilicon film 18 is sufficiently low, the molybdenum/silicide film 19 can be omitted.

Figure 3C:
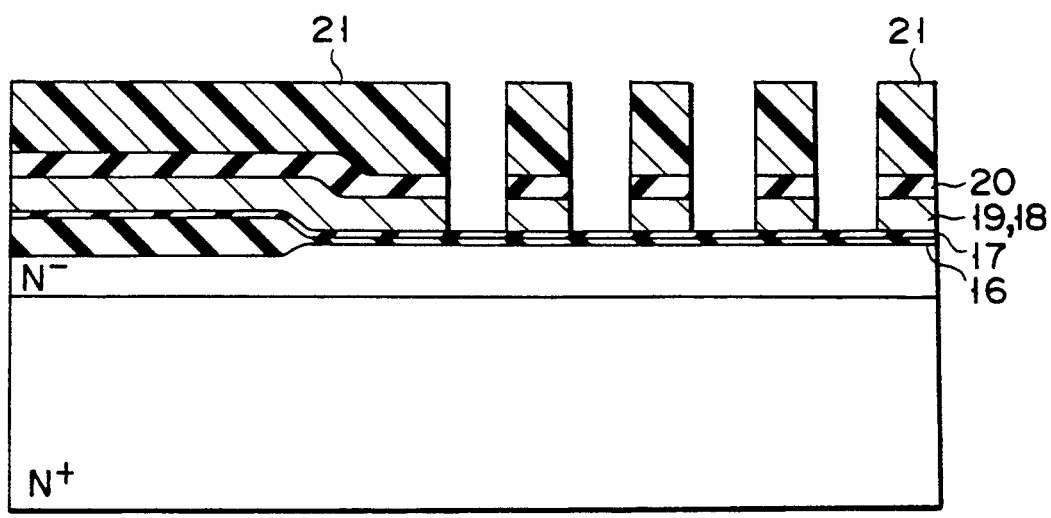

As shown in FIG. 3C, a resist mask 21 having openings respectively defining a plurality of prospective emitter formation regions is formed. Thereafter, the second oxide film 20, the molybdenum/silicide film 19, and the first polysilicon film 18 are sequentially etched to form self-aligned openings. Prior to this step, annealing is performed, as needed, to sufficiently activate the first polysilicon film 18 and the molybdenum/silicide film 19. Furthermore, the etching in this step is performed by an anisotropic etching method in order to accurately define the dimensions of a transistor. At least two or more openings are formed. In this embodiment, the width of each opening on a reticle is 1.0 μm, and the interval between the adjacent openings is 1.0 μm.

Figure 3D:
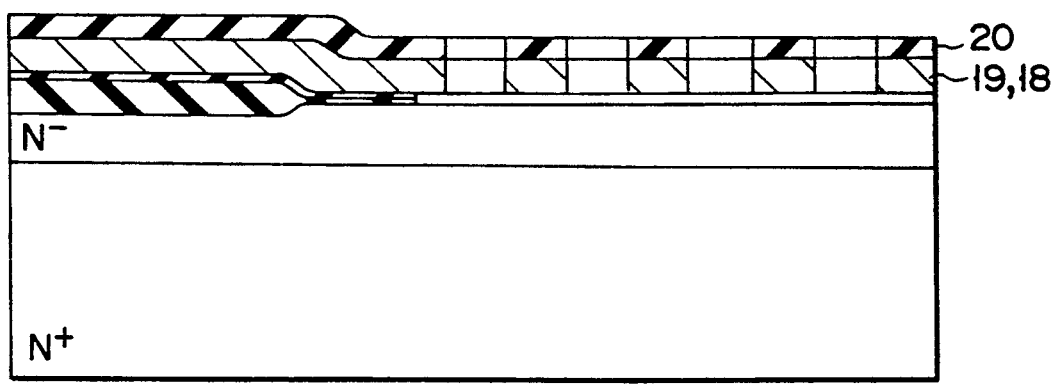

After the resist mask 21 is removed, as shown in FIG. 3D, the second nitride film 17 is etched by a phosphoric acid solution at a temperature of about 140° C. to 190° C., and the first oxide film 16 is then removed by etching. At this time, the second nitride film 17 is side-etched in a direction parallel to the major surface of the semiconductor substrate. As a result, an overhang portion (side etching portion) is formed on the outer peripheral portion of each emitter formation region. In this embodiment, the side etching amount is 0.5 μm, and the second nitride film between the adjacent openings is substantially removed.

The first oxide film 16 exposed to the self-aligned openings and the overhang portions continuous therewith is removed by a wet etching method using diluted hydrofluoric acid or ammonium fluoride.

Figure 3E:
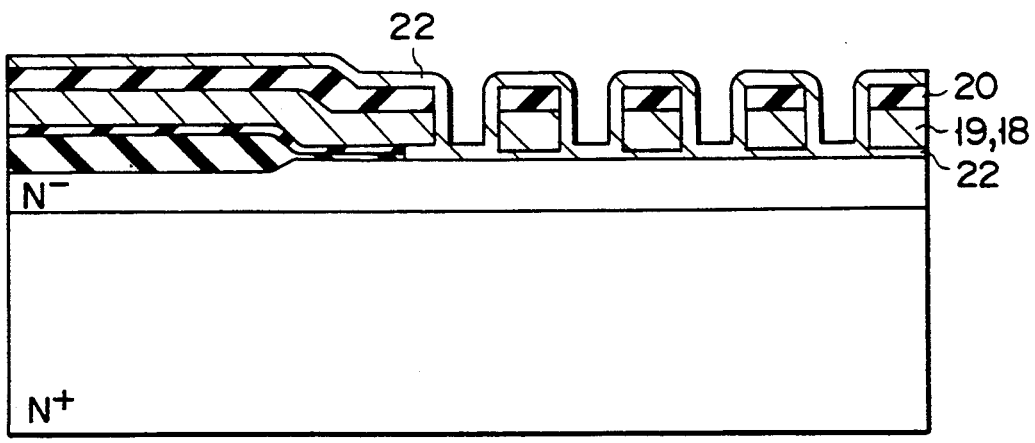

As shown in FIG. 3E, a second semiconductor film (e.g., a second polysilicon film) 22 is deposited on the resultant structure by CVD so as to bury polysilicon 22' in the overhang portions. In this embodiment, the thickness of the second polysilicon film 22 is about 200 nm.

Figure 3F:
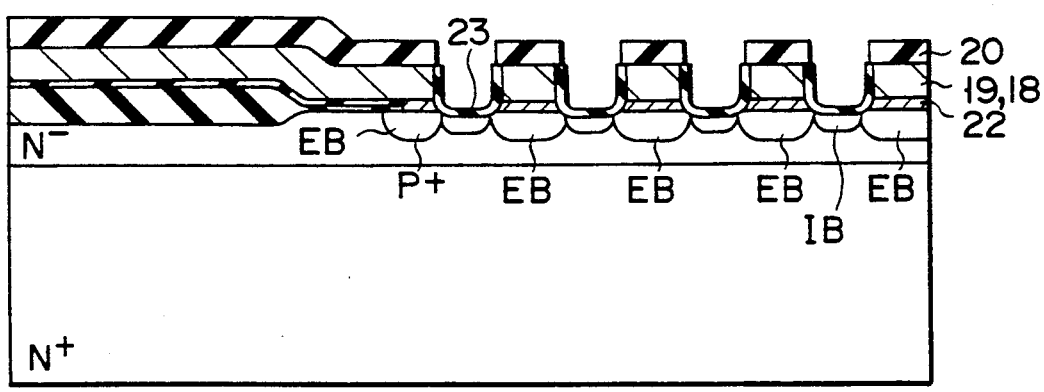
Figure 3G:
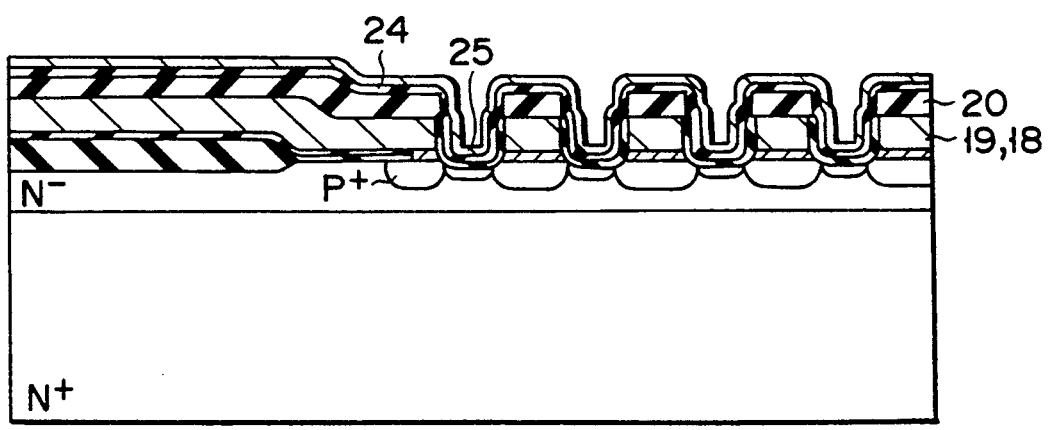

As shown in FIG. 3F, the second polysilicon film 22 is isotropically etched to leave the polysilicon 22' in the overhang portions. Subsequently, a fourth insulating film (e.g., a third oxide film) 23 is formed on the upper surfaces of the first polysilicon film 18 and the molybdenum/silicide film 19 exposed to the self-aligned openings, the second polysilicon 22' buried in the overhang portions, and the semiconductor substrate, thus forming internal base regions on surface portions exposed to the self-aligned openings in the major surface of the semiconductor substrate.

The third oxide film 2 is formed by thermal oxidation such that a thermal oxide film having a thickness of about 70 nm is grown immediately under each opening. In order to form internal bases, boron is ion-implanted at a dose of $5 \times 10^{13}/cm^2$, and annealing is performed. In this annealing step, boron ions are diffused into the semiconductor substrate through the first and second polysilicon films 18 and 22. As a result, a p+-type external base region EB is formed in the prospective element formation region on the major surface of the semiconductor substrate. Note that the thickness of the third oxide film 23 and the dose in ion implantation for the formation of the internal bases must be optimized in accordance with the characteristics of an element.

Subsequently, in order to ensure good insulating properties of the first polysilicon film 18 and the molybdenum/silicide film 19 which serve as an external base extraction electrode, and of an emitter electrode (to be formed later), a fourth oxide film 24 having a thickness of about 100 nm is formed by CVD, and a third polysilicon film 25 having a thickness of about 150 nm is then formed to form a side wall for defining emitter openings.

Figure 3H:
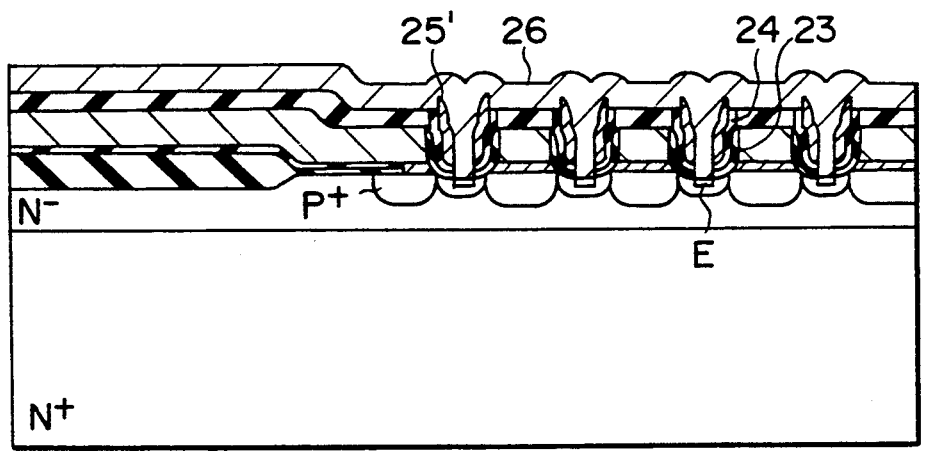

As shown in FIG. 3H, the third polysilicon film 25 is etched back by anisotropic etching to form a polysilicon side wall 25'. In addition, the fourth and third oxide films 24 and 23 exposed to emitter opening defining portions are removed by etching to form emitter openings. In this case, opening side wall portions of the fourth and third oxide films 24 and 23 are left. Furthermore, a third semiconductor film (e.g., a fourth polysilicon film) 26 serving as an emitter extraction electrode and emitter diffusion source is formed. An n-type impurity, e.g., arsenic, is doped in the fourth polysilicon film 26 serving as the emitter diffusion source at a dose of $7 \times 10^{15}/cm^2$ by ion implantation. An impurity may be doped in the fourth polysilicon film by a method other than ion implantation.

It is apparent that if a third metal/semiconductor film consisting of a conductive material having a band gap wider than that of silicon, e.g., SiC or microcrystal silicon is used in place of the fourth polysilicon film 26, an HBT (a heterobipolar transistor) can be realized.

Figure 3I:
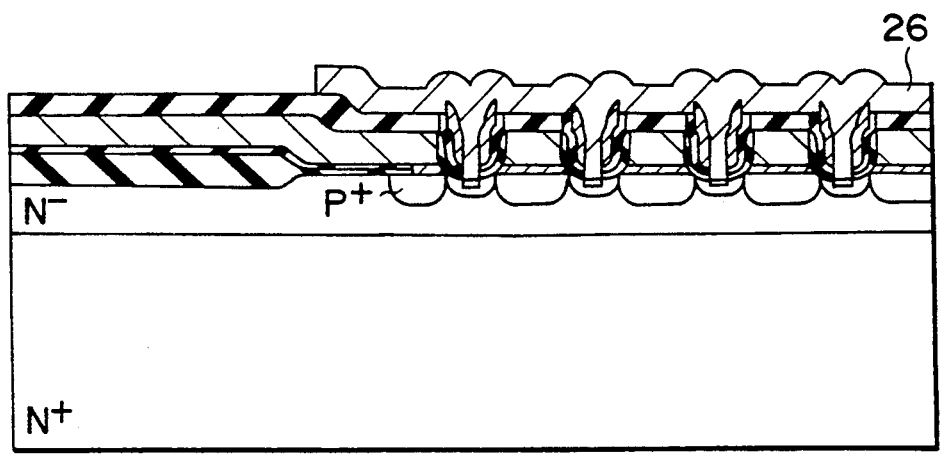

After an oxide film (not shown) serving as a protective film for preventing external diffusion of arsenic on the upper surface of the substrate is formed, annealing is performed at a temperature of about 950° C. for about 15 minutes to perform emitter diffusion, thus forming emitter regions E. After the annealing process, the above-mentioned oxide film is removed, and an unnecessary portion of the fourth polysilicon film 26 is removed, as shown in FIG. 3I.

Figure 3J:
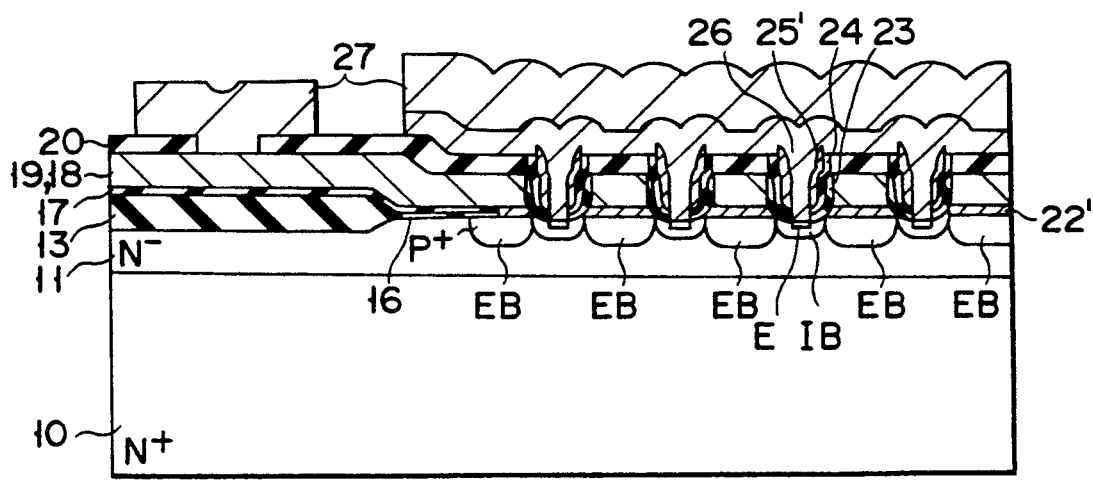

Subsequently, as shown in FIG. 3J, the second oxide film 20 on the molybdenum/silicide film 19 as the external base extraction electrode is partly removed to form a base electrode opening. In addition, a metal wiring layer (normally, an aluminum wiring layer) 27 is formed. With this process, a bipolar transistor having the planar pattern shown in FIG. 4 is completed.

The bipolar transistor shown in FIGS. 3J and 4 includes the p+-type external base region EB formed to enclose at least two internal regions on the n-type semiconductor substrate, a plurality of internal base regions IB formed by diffusing a p-type impurity in the entire surface of the internal regions enclosed within the external base region EB, and the n-type emitter regions E respectively formed in the plurality of internal base regions IB. The first and second insulating films 16 and 17 are stacked on a portion, of the semiconductor substrate major surface, corresponding to an outer peripheral region of the external base region EB. In the bipolar transistor of the present invention, the first and second insulating films 16 and 17 are formed to only extend outward from the outer peripheral region of the external base region EB, and hence are not present on the inner side of the external base region EB. The first semiconductor film 18 or the first metal/semiconductor film 19 containing a p-type impurity, and the third insulating film 20 are formed on the second insulating film 17 so as to extend to the edges of the openings in the second insulating film, and on the external base region between the plurality of emitter regions E. The second semiconductor region 22' containing an n-type impurity is buried in a gap between the first semiconductor film 18 or the first metal/semiconductor film 19 and the semiconductor substrate major surface. The fourth insulating film 23 is formed on a side wall portion, of the first semiconductor film 18 or the first metal/semiconductor film 19, opposite to the emitter regions, and on a portion, of the semiconductor substrate major surface, extending from the side wall portion toward the emitter regions. The third semiconductor films (or the third metal/semiconductor film) 25 and 26 are continuously formed on the upper surfaces of the emitter regions, on the emitter openings surrounded by the fourth insulating film 23, and on the third insulating film 20 in contact with the emitter openings.

According to the bipolar transistor having the above-described structure, unlike a normal self-aligned transistor, a plurality of element portions are formed in one island, and an external base region between adjacent element portions is commonly used thereby. Therefore, the element area can be decreased, and the stray capacitance between the external base extraction electrode and the semiconductor substrate major surface can be reduced. With this structure, an emitter opening width and a emitter/base interval which cannot be realized by a normal micropatterning process can be realized, thus providing a structure of a bipolar transistor having a sufficiently low base/collector capacitance.

In the above embodiment, a discrete device is exemplified. However, an output transistor of an ultra-high-speed IC can be formed by the same method as described above. In this case, since the length of an emitter peripheral portion which is mainly operated in a low-impurity concentration state is increased as compared with a conventional technique in which an emitter area is simply increased, an output transistor exhibiting high performance both in low- and high-current regions can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents

What is claimed is:

1. A bipolar transistor comprising:
   a semiconductor substrate of a first conductivity type;
   an external base region of a second conductivity type, said external base region being on a major surface of said semiconductor substrate;
   a plurality of internal base regions of the second conductivity type on the major surface of said semiconductor substrate, each of said internal base regions being surrounded by said external base region, and said external base region having a higher impurity concentration than each of said internal base regions;
   emitter regions of the first conductivity type respectively in said internal base regions;
   a first insulating layer on the major surface of said semiconductor substrate and extending outward from an outer peripheral portion of said external base region and defining openings therein;
   a base electrode extraction layer on said external base region, said base electrode extraction layer contacting with portion of said external base region between two of said internal base regions, and said base electrode extraction layer having a width equal to the distance between said two of said internal base regions;
   an insulating film on said base electrode extraction layer;
   a second insulating layer on side wall portions of said base electrode extraction layer adjacent to said emitter regions, and on a portion of the major surface of said semiconductor substrate extending from the side wall portions to said emitter regions; and
   an emitter electrode extraction layer on said second insulating layer and contacting with said emitter regions.

2. A transistor according to claim 1, wherein said first insulating layer is composed of first and second insulating films stacked on each other, and wherein said insulating film on said base electrode extraction layer is a third insulating film.

3. A transistor according to claim 1, wherein said first and second insulating films are respectively composed of an oxide film and a nitride film.

4. A transistor according to claim 2, wherein said second insulating layer is composed of fourth and fifth insulating films stacked on each other.

5. A transistor according to claim 4, wherein said fourth and fifth insulating films are oxide films.

6. A transistor according to claim 1, wherein said base electrode extraction layer is composed of a semiconductor film and a metal/semiconductor film both of which contain an impurity of the second conductivity type.

7. A transistor according to claim 1, wherein said emitter electrode extraction layer is composed of a semiconductor film containing an impurity of the first conductivity type.

8. A transistor according to claim 1, wherein said base electrode extraction layer is composed of a semiconductor film and a metal/semiconductor film both of which contain an impurity of the first conductivity type.

9. A bipolar transistor comprising:
   a semiconductor substrate of a first conductivity type;
   an external base region of a second conductivity type, said external base region being on a major surface of said semiconductor substrate;
   a plurality of internal base regions containing an impurity of the second conductivity type on the major surface of said semiconductor substrate, each of said internal base regions being surrounded by said external base region, and said external base region having a higher impurity concentration than each of said internal base regions;
   emitter regions of the first conductivity type respectively in said internal base regions;
   first and second insulating films, said first film being positioned on said second film, and said first and second insulating films being on the major surface of said semiconductor substrate and extending outward from an outer peripheral portion of said external base region and defining openings therein;
   a base electrode extraction layer on said external base region, said base electrode extraction layer contacting with portions of said external base region between two of said internal base regions, and said base extraction layer having a width equal to the distance between said two of said internal base regions;
   a third insulating film on said base electrode extraction layer;
   fourth and fifth insulating films positioned one on the other, said fourth and fifth insulating films on side wall portions of said base electrode extraction layer adjacent to said emitter regions, and on a portion of the major surface of said semiconductor substrate extending from the side wall portions to said emitter regions; and
   an emitter electrode extraction layer on said fifth insulating film and contacting with said emitter regions.

10. A transistor according to claim 9, wherein said base electrode extraction layer is composed of a semiconductor film and a metal/semiconductor film both of which contain an impurity of the second conductivity type.

11. A transistor according to claim 9, wherein said base electrode extraction layer is composed of a semiconductor film and a metal/semiconductor film both of which contain an impurity of the first conductivity type.

* * * * *